(12) United States Patent
Qian et al.

(10) Patent No.: US 11,579,209 B2
(45) Date of Patent: Feb. 14, 2023

(54) THREE-AXIS MAGNETIC SENSOR

(71) Applicants: Zhenghong Qian, Eden Prairie, MN (US); Ru Bai, Zhejiang (CN)

(72) Inventors: Zhenghong Qian, Eden Prairie, MN (US); Ru Bai, Zhejiang (CN)

(*) Notice: Subject to any disclaimer, the term of this patent is extended or adjusted under 35 U.S.C. 154(b) by 508 days.

(21) Appl. No.: 16/476,270

(22) PCT Filed: Oct. 22, 2018

(86) PCT No.: PCT/CN2018/111130
§ 371 (c)(1),
(2) Date: Jul. 5, 2019

(87) PCT Pub. No.: WO2019/242175
PCT Pub. Date: Dec. 26, 2019

(65) Prior Publication Data
US 2021/0356533 A1   Nov. 18, 2021

(30) Foreign Application Priority Data

Jun. 22, 2018 (CN) .......................... 201810652651.7
Jun. 22, 2018 (CN) .......................... 201820970160.2

(51) Int. Cl.
*G01R 33/00* (2006.01)
*G01R 33/02* (2006.01)
*G01R 33/09* (2006.01)

(52) U.S. Cl.
CPC ...... *G01R 33/0011* (2013.01); *G01R 33/0206* (2013.01); *G01R 33/09* (2013.01)

(58) Field of Classification Search
CPC . G01R 33/0011; G01R 33/0206; G01R 33/09
See application file for complete search history.

(56) References Cited

U.S. PATENT DOCUMENTS

| | | | | |
|---|---|---|---|---|
| 7,054,114 B2* | 5/2006 | Jander | ................... | H01F 10/324 360/324.1 |
| 7,965,077 B2* | 6/2011 | Engel | ................... | G01R 33/093 324/252 |
| 8,518,734 B2* | 8/2013 | Whig | ...................... | B82Y 25/00 438/73 |
| 10,066,940 B2* | 9/2018 | Deak | ....................... | G01C 17/28 |
| 2012/0299587 A1* | 11/2012 | Rieger | ............... | G01R 33/0206 324/247 |

(Continued)

*Primary Examiner* — Reena Aurora

(57) ABSTRACT

A three-axis magnetic sensor apparatus is described that is processed together into a single chip, with high performance, low cost, as well as small size. The three-axis magnetic sensor apparatus include a substrate, a two-axis magnetic sensing structure and a single-axis sensing structure. The two-axis sensing magnetic structure consisting of two shielded Wheatstone bridge configurations in conjunction with an annular or semi annular magnetic flux-guiding structure, and the single-axis sensing structure consisting of a push-pull Wheatstone bridge in conjunction with a flux guide that is capable of generating a fringe field whose horizontal component is proportional to the vertical component of an external magnetic field. The two-axis magnetic sensing structure and the single-axis structure are processed together into a single chip, and can be used to measure respectively X, Y and Z components of external magnetic fields.

8 Claims, 5 Drawing Sheets

(56) References Cited

U.S. PATENT DOCUMENTS

2015/0309125 A1* 10/2015 Huang ............... G01R 33/0052
 216/22
2017/0176545 A1* 6/2017 Deak ....................... H01L 43/12

* cited by examiner

THREE-AXIS MAGNETIC SENSOR

CROSS REFERENCE OF RELATED APPLICATION

This is a U.S. National Stage under 35 U.S.C 371 of the International Application PCT/CN2018/111130, filed Oct. 22, 2018, which claims priority under 35 U.S.C. 119(a-d) to CN201810652651.7, filed Jun. 22, 2018; and CN201820970160.2, filed Jun. 22, 2018.

BACKGROUND OF THE PRESENT INVENTION

Field of Invention

The present invention belongs to the technical field of magnetic sensors, and relates to a three-axis magnetic sensor.

Description of Related Arts

Giant magnetoresistance (GMR) effect is discovered in magnetic multilayer films by Albert Fert and Peter Grünberg, independently, in 1988. The GMR sensor has advantages of higher sensitivity, lower power consumption, and better linearity as compared to anisotropic magnetoresistance (AMR) sensors and Hall sensors. In addition, GMR sensors are easy to be integrated with semiconductor circuits, and are considered to be one of the best candidates as small size, low power, high performance magnetic sensors.

At present, the technology of three-axis magnetic sensors usually encapsulates three dies of single-axis magnetic sensors into the same package, in which three dies are arranged in the directions that can separately measure the magnetic field components along X axis, Y axis and Z axis. However, this technology has several drawbacks including complex packaging process, large package size, and high cost. For example, the patent with a publication number of CN102426344B uses a design that encapsulates three identical sensor dies where two of the dies are placed in the X-Y plane with the sensitive axes respectively along the X-axis and Y-axis, while the other die is placed vertically to the X-Y plane for the purpose of measuring the Z axis component of the external magnetic field. A patent with an application number of US20120299587A1 uses a two-axis magnetoresistive sensor to measure respectively X- and Y-components of external magnetic field, and uses a Hall sensor to measure Z-component of external magnetic field. The patent US20150309125A1 is to deposit and pattern a plurality of magnetic sensing elements on the slopes created by the MEMS technology on the substrate, and a magnetic field can be measured by the sensing units, and calculated by a simple algorithm as an expression of measurement values and slope angles of the sensing unit.

However, the above-mentioned techniques have the drawbacks including complex device process, difficult packaging process, and large sensitivity variation along X, Y and Z directions.

This invention will overcome the drawbacks regarding to the above-mentioned techniques, and lead to a low cost, highly integrated and single-chip three-axis magnetic sensor.

SUMMARY OF THE PRESENT INVENTION

An aim of the invention is to provide an integrated three-axis magnetic sensor.

The invention comprises a substrate, a two-axis magnetic sensing structure consisting of two Wheatstone bridge configurations in conjunction with an annular or semi annular magnetic flux-guiding structure, and another single-axis sensing structure consisting of a push-pull Wheatstone bridge in conjunction configuration with a flux guide that is capable of generating a fringe field whose horizontal component is proportional to vertical component of a magnetic field.

The two-axis magnetic sensing structure with two Wheatstone bridge configurations and a single-axis structure with a push-pull Wheatstone bridge configuration are processed together into a single chip, and is for measuring respectively an X-component, a Y-component and a Z component of an external magnetic field.

The two-axis magnetic structure has a magnetic flux guide in a shape of a square ring or a circular structure, in which four gaps are symmetrically located along a structure of the magnetic flux guide. Each of the four gaps has a similar shape of parallelogram. Four magnetoresistors $R_1$, $R_3$, $R_5$, $R_7$ are placed respectively in the four gaps, and another four magnetoresistors $R_2$, $R_4$, $R_6$, $R_8$ are placed and shielded under the magnetic flux guide. The magnetoresistors $R_1$, $R_3$, $R_5$, $R_7$ placed in the four gaps are with the length parallel to the respective edge of the four gaps; Wheatstone bridge 1 and 2 and formed from the eight magnetoresistors: the bridge 1 is composed of two magnetoresistors $R_1$, $R_3$ in the gaps and another two magnetoresistors $R_2$, $R_4$ under the magnetic flux guide. The bridge 2 comprises two magnetoresistors $R_5$, $R_7$ in the gaps and another two magnetoresistors $R_6$, $R_8$ under the magnetic flux guide. Bridge 1 is used to measure the X-component of the external magnetic field, while bridge 2 is for measuring the Y-component of the external magnetic field.

The single-axis sensing structure is with a push-pull Wheatstone configuration comprising a flux guide in a rectangular shape where magnetoresistors $R_9$ and $R_{11}$ are placed geometrically in the opposite side of the flux guide relative to magnetoresistors $R_{10}$ and $R_{12}$. The magnetoresistors are capable of sensing the X-component of the magnetic fringe field at a proximity of the flux guide induced by the component of magnetic field along the Z axis. The X-component of the magnetic fringe fields generated on opposite sides of the flux guide are directionally antiparallel, leading to a push-pull sensing bridge that is capable of producing a differential output proportional to the external magnetic component along the Z axis.

The single-axis sensing structure is placed inside or outside of the annular or semi annular magnetic guiding structure within the two-axis magnetic sensing structure. The substrate is silicon substrate, sapphire substrate glass substrate or polymer substrate. The magnetoresistors are made from materials of Anisotropic Magnetoresistance (AMR), the giant magnetoresistance (GMR) or the tunneling magnetoresistance (TMR). The flux guides are composed of soft magnetic materials. Furthermore, the sensing structure could be integrated together with semiconductor circuits in an IC compatible wafer process. In addition, the Wheatstone bridges could be composed of either four resistors forming a full-bridge structure or two resistors forming a half-bridge structure.

DETAILED DESCRIPTION OF THE PREFERRED EMBODIMENT

Figure 1:
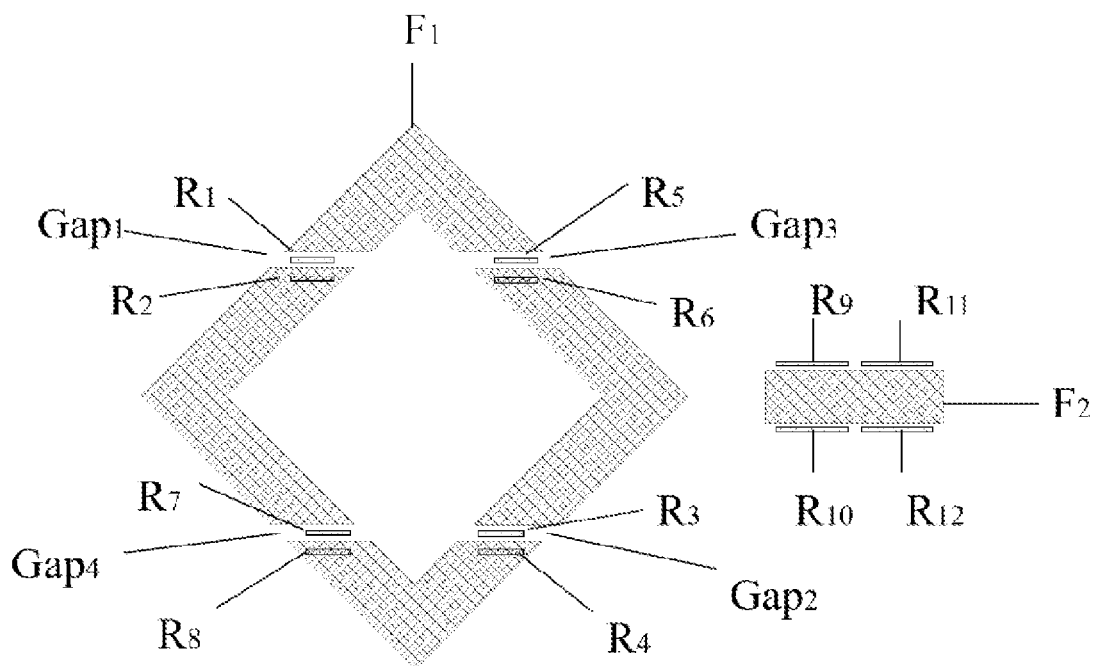
FIG. 1 is a schematic diagram of an overall structure according to a first embodiment of the present invention.

A three-axis magnetic sensor, comprises: a substrate, a two-axis magnetic sensing structure consisting of two Wheatstone bridge configurations within an annular or semi annular magnetic flux-guiding structure, and a single-axis sensing structure consisting of a push-pull Wheatstone bridge configuration with a flux guide to generate fringe field proportional to vertical component of magnetic field signal. The single-axis structure is placed outside of the annular magnetic flux guide of the two-axis magnetic sensing structure.

The two-axis magnetic sensing structure is set on the substrate, and the external frame of the flux guide 1 is a shape of a square ring or a circular structure. The flux guide is divided into four segments by four gaps. The four gaps of the shielding structure have shapes of parallelogram (with the sharp angles in the range of above 0 degree and below 90 degree). Four sensitive magnetoresistors $R_1$, $R_3$, $R_5$, $R_7$ placed in the four gaps, and another four shielded magnetoresistors $R_2$, $R_4$, $R_6$, $R_8$ are placed under the magnetic flux guide segments. The magnetoresistors have a shape of parallelogram or square or rectangle with two sides parallel to the edge of the gaps. The eight resistors make up two Wheatstone bridge 1 and 2; wherein bridge 1 is used to measure the magnetic component of the magnetic field along the X-axis, and bridge 2 is used to measure the magnetic component of the magnetic field along the Y-axis. The bridge 1 comprises two magnetoresistors $R_1$, $R_3$ in the gaps that is capable of sensing the X-axis magnetic component and another two magnetoresistors $R_2$, $R_4$ under the magnetic flux guide. The bridge 2 comprises two magnetoresistors $R_5$, $R_7$ in the gaps that is capable of sensing the Y-axis magnetic component and another two shielded magnetoresistors $R_6$, $R_8$ under the magnetic flux guide.

The single-axis sensing structure is with a push-pull Wheatstone configuration comprising a flux guide in a rectangular shape. The push-pull Wheatstone bridge consists of four magnetoresistors, in which two magnetoresistors $R_9$ and $R_{11}$ are placed symmetrically to the opposite side of the flux guide relative to the other two magnetoresistors $R_{10}$ and $R_{12}$. The magnetoresistors is capable of sensing the X-axis component of the magnetic fringe field at the proximity of the flux guide induced by the component of magnetic field along the Z axis. The X-axis component of the magnetic fringe fields generated on the opposite sides of the flux guide are directionally antiparallel, leading to a push-pull sensing bridge that is capable of producing a differential output proportional to the external magnetic component along the Z axis.

Magnetic flux guide is usually made of soft magnetic material of high permeability, such as nickel iron, iron silicon alloy (silicon steel sheet) or various soft ferrite materials.

As shown in FIG. 1, in the preferred embodiment 1, the single-axis magnetic sensor is placed outside the flux guide F1 of the two-axial magnetic sensing structure.

Figure 2:
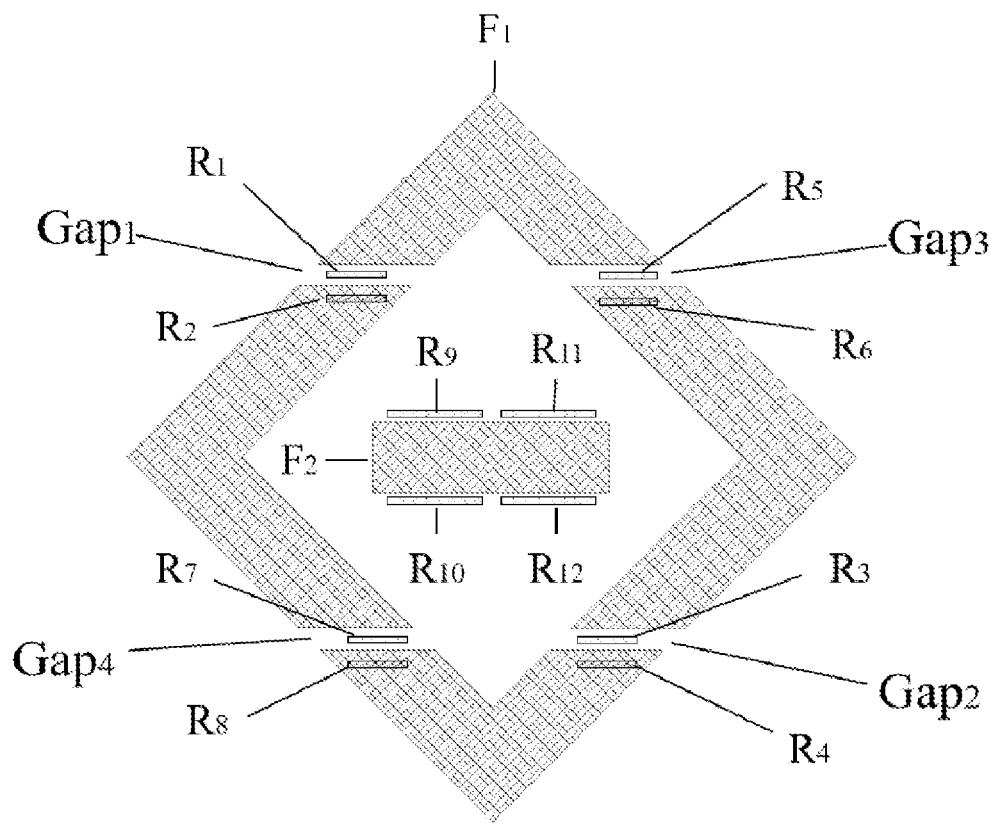
FIG. 2 is a schematic diagram of the overall structure according to a second embodiment of the present invention.

As shown in FIG. 2, in the preferred embodiment 2, the single axis magnetic sensor is placed inside the flux guide F1 of two-axis magnetic sensing structure, which is capable of greatly reducing the interference of the horizontal magnetic field to the single-axis magnetic sensing structure.

Figure 3:
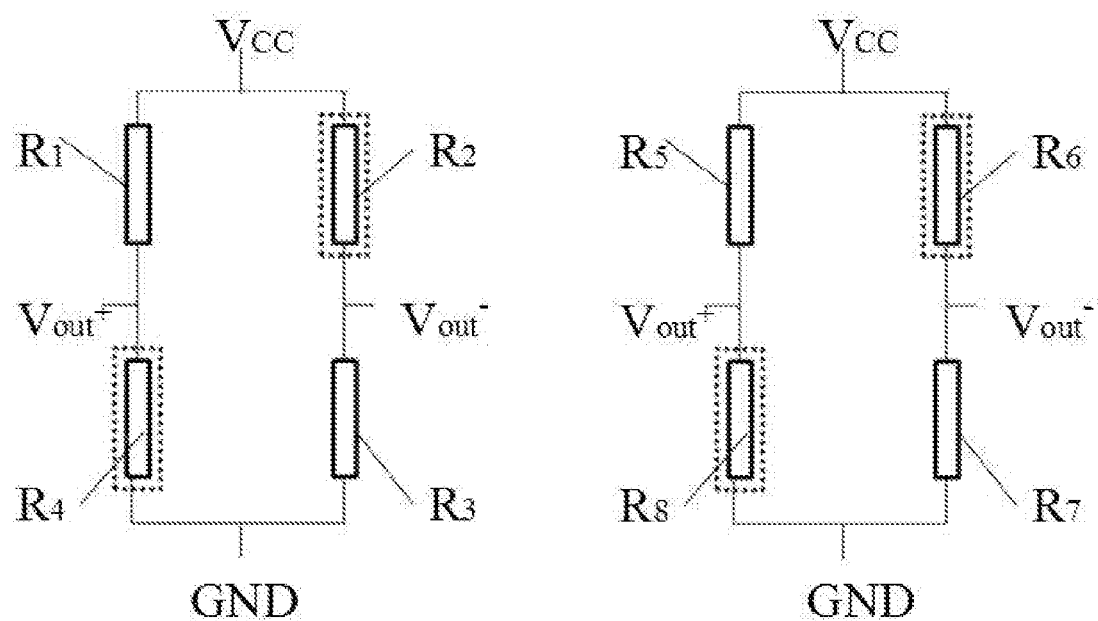
FIG. 3 is schematic diagrams exhibiting two Wheatstone bridges within the two-axis sensing structure.
Figure 4:
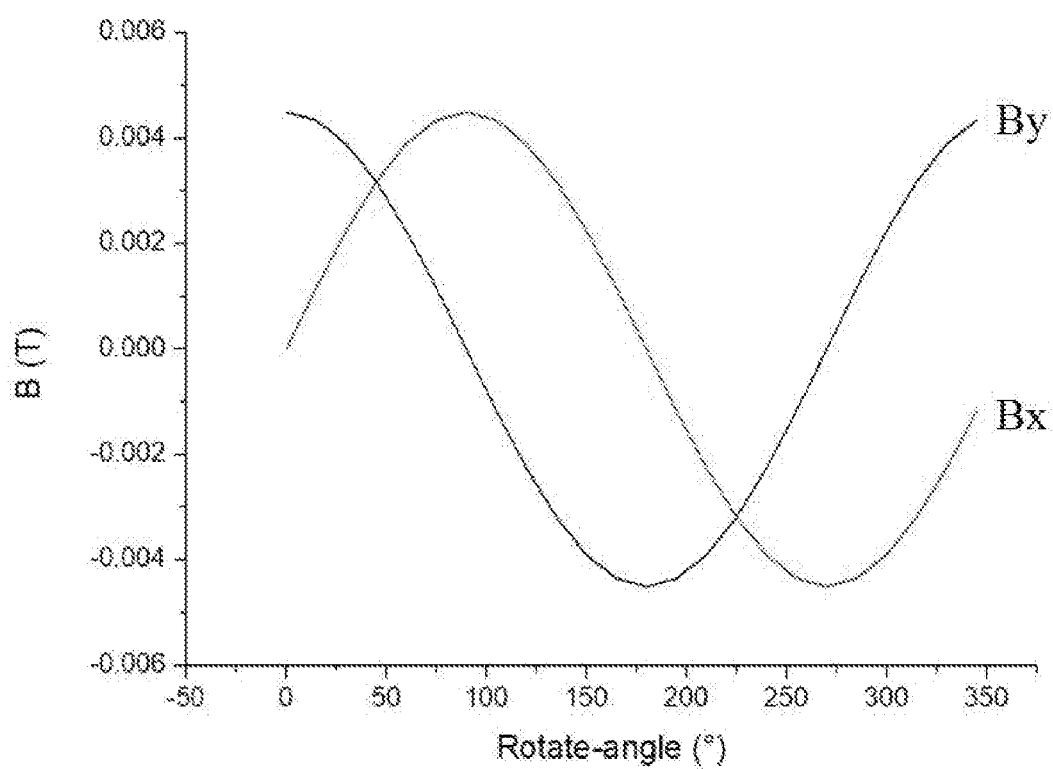
FIG. 4 is a simulated output for X- and Y-magnetic field components verses an angle between the X axis and the applied rotating magnetic field within two-axis sensing structure.

For above mentioned preferred embodiments, the two-axis magnetic sensing structure consists of eight magnetic sensitive resistors, the flux guide F1 has a square ring structure with four gaps, with one magnetoresistor placed in each gap, and another four magnetoresistors placed under the four flux guide segments. The eight resistors make up two Wheatstone bridge 1 and bridge 2. As shown in FIG. 3, the bridge 1 is composed of two magnetoresistors $R_1$, $R_3$ in the gaps that is capable of sensing the X-axis magnetic component and two magnetoresistors $R_2$, $R_4$ shielded by the magnetic flux guide. The bridge 2 comprises two sensitive magnetoresistors $R_5$, $R_7$ in the gaps that is capable of sensing the Y-axis magnetic component and two magnetoresistors $R_6$, $R_8$ under the magnetic flux guide. The two Wheatstone bridge measures the magnetic components of the external magnetic field along the X-axis and Y-axis respectively. The output simulation curves of the two Wheatstone bridges are shown in FIG. 4. The two output simulation curves are typical cosine curves with a phase angle difference of about 90 degrees.

Figure 5:
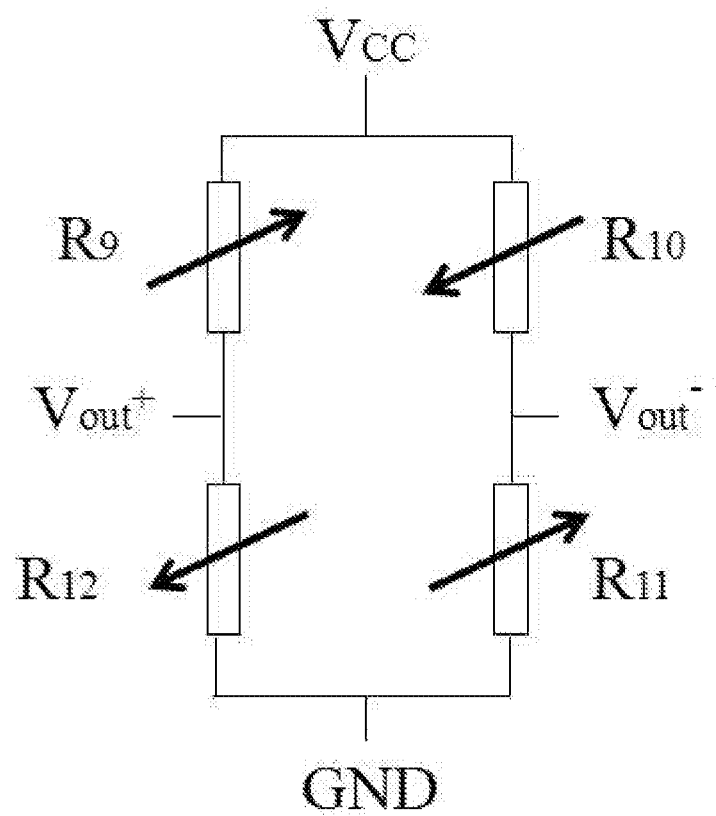
FIG. 5 is a schematic diagram of the Wheatstone bridge within the single-axis magnetic sensing structure.

For above mentioned preferred embodiments, the single-axis magnetic sensing structures consist of four magnetic sensitive resistors. The flux guide F2 has a shape of square or rectangle with four resistors placed symmetrically on two sides of the flux guide F2. The two magnetoresistors $R_9$ and $R_{11}$ are geometrically placed on one side of the flux guide, while the other two magnetoresistors $R_{10}$ and $R_{12}$ are placed on the other side. The external magnetic component along the Z axis could induce an X-axis component of the magnetic fringe field at the proximity of the flux guide, and the directions of the X-axis components are anti-parallel on both opposite sides of the flux guide. As shown in FIG. 5.

Figure 6:
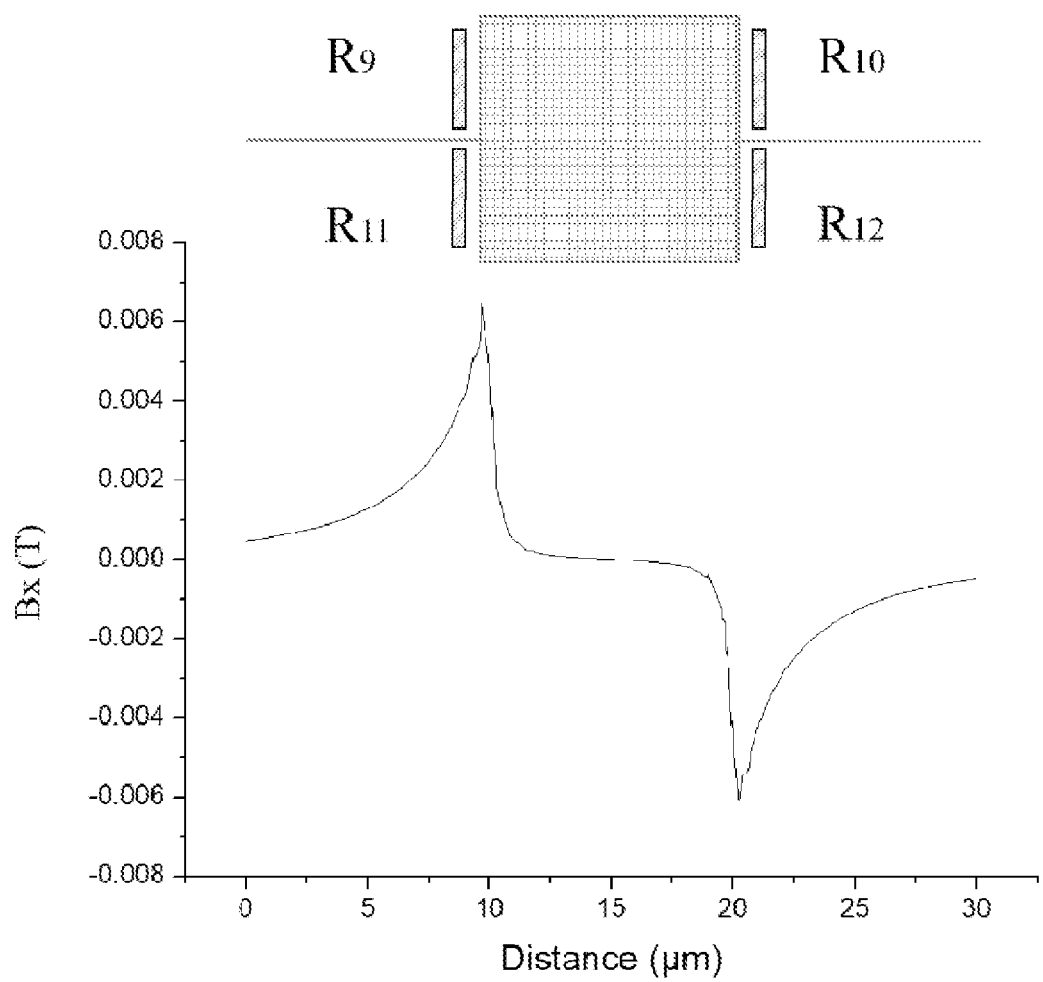
FIG. 6 is a simulated output verses the Z-axis component of applied magnetic field in the single-axis magnetic sensing structure.

As shown in FIG. 6, the simulation curve shows that the X-axis component of excited fringe field generated by the Z-axis component of the external magnetic field varies with the distance away from the center of the flux guide F2. It is noted that the X-axis components of excited fringe fields on two sides of the flux guide F2 exhibit the same amplitude symmetrically with the opposite field direction. Therefore, if there is an external magnetic field with the Z-axis components, the magnetoresistances of the $R_9$ and $R_{11}$ will increase/decrease, while the magnetoresistances of $R_{10}$ and $R_{12}$ will decrease/increase in a push-pull mode, producing a differential output that is proportional to the Z-axis component of the external magnetic field. As for the configuration of the preferred embodiment 2 shown in FIG. 2, there is another advantage in that the flux guide F1 could shield the influence of the X-axis component of the external magnetic field on the inside single-axis sensing structure, which measures the Z-axis component of the external field.

For those skilled in the art, it is clear that the invention technology is not limited to the details of the above exemplary embodiments, and that the invention technology can be realized in other specific forms without departing from the spirit or basic characteristics of the invention technology.

Therefore, at any point, an example should be regarded as exemplary and unrestrictive, and the scope of the invention technology is defined by the appended claims rather than the above description, so that changes in the meaning and scope of the equivalent elements of the claim are included in the technology of the invention. Any appended map mark in the claim shall not be regarded as a limitation of the claims.

What is claimed is:

1. A three-axis magnetic sensor apparatus comprising: a substrate, a two-axis magnetic sensing structure consisting two shielded Wheatstone bridge configurations in conjunction with a first magnetic flux guide which is annular or semi annular, and a single-axis sensing structure consisting a push-pull Wheatstone bridge configuration in conjunction with a second magnetic flux guide that is capable of generating a fringe field whose horizontal component is proportional to vertical component of a magnetic field;

wherein the second magnetic flux guide in a rectangular shape where two magnetoresistors of the push-pull Wheatstone bridge configuration are geometrically placed in the opposite side of the second magnetic flux guide relative to the other two magnetoresistors of the push-pull Wheatstone bridge configuration;

wherein the two-axis magnetic sensing structure with two shielded Wheatstone bridge configurations and a single-axis structure with a push-pull Wheatstone bridge configuration are processed together into a single chip, and is for measuring an X-component, a Y-component and a Z-component of an external magnetic field;

wherein the two-axis magnetic structure has a first magnetic flux guide in a shape of a square ring or a circular structure, in which four gaps are symmetrically located along a structure of the first magnetic flux guide; wherein each of the four gaps has a similar shape of parallelogram; four magnetoresistors $R_1$, $R_3$, $R_5$, $R_7$ are placed respectively in the four gaps, and another four magnetoresistors $R_2$, $R_4$, $R_6$, $R_8$ are placed an d shielded under the first magnetic flux guide; the magnetoresistors ($R_1$, $R_3$, $R_5$, $R_7$) placed in the four gaps are with the length parallel to the respective edge of the four gaps; Wheatstone bridge 1 and 2 and formed from the eight magnetoresistors: the bridge 1 comprises two magnetoresistors $R_1$, $R_3$ in the gaps and another two magnetoresistors $R_2$, $R_4$ under the first magnetic flux guide; the bridge 2 comprises two magnetoresistors $R_5$, $R_7$ in the gaps and another two magnetoresistors $R_6$, $R_8$ under the first magnetic flux guide; bridge 1 is used to measure the X-component of the external magnetic field, while bridge 2 is for measuring the Y-component of the external magnetic field.

2. The three-axis magnetic sensor apparatus of claim 1, wherein the single-axis sensing structure is with the push-pull Wheatstone configuration comprising the second magnetic flux guide in a rectangular shape where magnetoresistors $R_9$ and $R_{11}$ are geometrically placed in the opposite side of the second magnetic flux guide relative to magnetoresistors $R_{10}$ and $R_{12}$; the magnetoresistors are capable of sensing the X-component of the magnetic fringe field at a proximity of the second magnetic flux guide induced by the component of magnetic field along the Z axis; the X-component of the magnetic fringe fields generated on opposite sides of the second magnetic flux guide are in directionally antiparallel, leading to a push-pull sensing bridge that is capable of producing a differential output proportional to the external magnetic component along the Z axis.

3. The three-axis magnetic sensor apparatus of claim 1, wherein the single-axis sensing structure is placed inside or outside of the annular or semi annular magnetic guiding structure within the two-axis magnetic sensing structure.

4. The three-axis magnetic sensor apparatus of claim 1, wherein the substrate is a silicon substrate, a sapphire substrate, a glass substrate or a polymer substrate.

5. The three-axis magnetic sensor apparatus of claim 1, wherein the magnetoresistors are made from materials of Anisotropic Magnetoresistance (AMR), giant magnetoresistance (GMR) or tunneling magnetoresistance (TMR).

6. The three-axis magnetic sensor apparatus of claim 1, wherein both the first magnetic flux guide and the second magnetic flux guide are composed of soft magnetic materials.

7. The three-axis magnetic sensor apparatus of claim 1, wherein the sensing structure is integrated together with semiconductor circuits in an IC compatible wafer process.

8. The three-axis magnetic sensor apparatus of claim 1, wherein the Wheatstone bridges is composed of either four resistors forming a full-bridge structure or two resistors forming a half-bridge structure.

* * * * *